United States Patent
Luft

(10) Patent No.: US 11,495,941 B1
(45) Date of Patent: Nov. 8, 2022

(54) CONTROLLING OPTICAL PULSE SHAPE OF A SOLID-STATE EMITTER

(71) Applicant: Apple Inc., Cupertino, CA (US)

(72) Inventor: Ido Luft, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 170 days.

(21) Appl. No.: 17/143,184

(22) Filed: Jan. 7, 2021

Related U.S. Application Data

(60) Provisional application No. 63/070,292, filed on Aug. 26, 2020, provisional application No. 62/965,908, filed on Jan. 26, 2020.

(51) Int. Cl.
| | |
|---|---|
| *H01S 5/042* | (2006.01) |
| *H01S 5/183* | (2006.01) |
| *H01S 5/0683* | (2006.01) |
| *H01S 5/068* | (2006.01) |

(52) U.S. Cl.
CPC ........ *H01S 5/0427* (2013.01); *H01S 5/06808* (2013.01); *H01S 5/06832* (2013.01); *H01S 5/183* (2013.01)

(58) Field of Classification Search
CPC .......................... H01S 5/06808; H01S 5/06832
USPC ...................................................... 372/38.03
See application file for complete search history.

(56) References Cited

U.S. PATENT DOCUMENTS

| | | |
|---|---|---|
| 6,389,050 B2 | 5/2002 | Stronczer |
| 6,683,896 B2 | 1/2004 | Heilman et al. |
| 6,947,456 B2 | 9/2005 | Chin et al. |
| 7,496,122 B2 | 2/2009 | Bozso et al. |
| 8,170,075 B1 | 5/2012 | Borschowa |
| 9,368,936 B1 * | 6/2016 | Lenius ................... G01S 17/10 |
| 2011/0085576 A1 * | 4/2011 | Crawford ............... H05B 45/38 372/38.07 |
| 2011/0164636 A1 | 7/2011 | Tanaka |
| 2016/0341664 A1 | 11/2016 | Rothberg et al. |
| 2018/0323576 A1 | 11/2018 | Crawford et al. |

* cited by examiner

*Primary Examiner* — Tuan N Nguyen
(74) *Attorney, Agent, or Firm* — Kligler & Associates Patent Attorneys Ltd

(57) ABSTRACT

An optoelectronic device includes a laser diode having a cathode terminal and an anode terminal, which is connected to a driving voltage. A driver is coupled to drive current pulses through the laser diode from the anode terminal to the cathode terminal. A discharge switch has a first switch terminal connected to the cathode terminal and a second switch terminal connected to a discharge voltage, which is equal to or greater than the driving voltage, and is configured, when closed, to raise the cathode terminal to the discharge voltage. A switch control circuit has an input connected to the cathode terminal and an output connected to close the discharge switch in response to the current pulses occurring at the input.

20 Claims, 2 Drawing Sheets

CONTROLLING OPTICAL PULSE SHAPE OF A SOLID-STATE EMITTER

CROSS-REFERENCE TO RELATED APPLICATION

This application claims the benefit of U.S. Provisional Patent Application 62/965,908, filed Jan. 26, 2020, and U.S. Provisional Patent Application 63/070,292, filed Aug. 26, 2020, both of which are incorporated herein by reference.

FIELD OF THE INVENTION

The present invention relates generally to optoelectronic devices, such as vertical-cavity surface-emitting lasers (VCSELs), and particularly to circuits and methods for driving such devices to generate short optical pulses.

BACKGROUND

Semiconductor laser diodes, and particularly VCSELs, are used in a variety of applications to generate short, high-power optical pulses. For example, in depth mapping based on time of flight (ToF) measurement, one or more VCSELs direct optical pulses toward a target scene, and a receiver senses the times of arrival of photons reflected back from points in the scene in order to create the depth map. The temporal resolution of the ToF measurements, and hence the depth resolution of the map, are limited by the temporal duration of the optical pulses emitted by the VCSELs. For this reason, the VCSELs are typically driven to emit pulses having a duration on the order of one nanosecond or less.

SUMMARY

Embodiments of the present invention that are described hereinbelow provide improved optoelectronic devices and methods for driving such devices.

There is therefore provided, in accordance with an embodiment of the invention, an optoelectronic device, including a laser diode having a cathode terminal and an anode terminal, which is connected to a driving voltage. A driver is coupled to drive current pulses through the laser diode from the anode terminal to the cathode terminal. A discharge switch has a first switch terminal connected to the cathode terminal and a second switch terminal connected to a discharge voltage, which is equal to or greater than the driving voltage, and is configured, when closed, to raise the cathode terminal to the discharge voltage. A switch control circuit has an input connected to the cathode terminal and an output connected to close the discharge switch in response to the current pulses occurring at the input.

In one embodiment, the discharge switch is connected in parallel with the laser diode, such that the discharge voltage is equal to the driving voltage, and the switch is configured, when closed, to form a short circuit between the anode terminal and the cathode terminal. Alternatively, the discharge voltage is greater than the driving voltage, and the switch is configured, when closed, to reverse-bias the laser diode.

In a disclosed embodiment, the laser diode includes a vertical-cavity surface-emitting laser (VCSEL). Alternatively or additionally, the driver includes a current source and is configured to generate the current pulses with a pulse width less than 2 ns.

In one embodiment, the discharge switch includes a PNP transistor, including an emitter serving as the second switch terminal, a collector serving as the first switch terminal, and a base connected to the output of the switch control circuit. In another embodiment, the discharge switch includes a PMOS transistor, including a drain serving as the second switch terminal, a source serving as the first switch terminal, and a gate connected to the output of the switch control circuit.

In a disclosed embodiment, the switch control circuit includes a low-pass filter connected between the input and the output. Alternatively or additionally, the switch control circuit includes a comparator, which is configured to compare the input to a reference voltage. Further alternatively or additionally, the switch control circuit includes a threshold detector, which is configured to close the discharge switch when the input passes a predefined threshold.

There is also provided, in accordance with an embodiment of the invention, a method for driving a laser diode having a cathode terminal and an anode terminal. The method includes connecting the anode terminal to a driving voltage and connecting a driver to the cathode terminal so as to drive current pulses through the laser diode from the anode terminal. A first switch terminal of a discharge switch is connected to the cathode terminal, and a second switch terminal of the discharge switch is connected to a discharge voltage, which is equal to or greater than the driving voltage, such that when the discharge switch is closed, the cathode terminal is raised to the discharge voltage. An input of a switch control circuit is coupled to the cathode terminal, and an output of the switch control circuit is connected to close the discharge switch in response to the current pulses occurring at the input.

The present invention will be more fully understood from the following detailed description of the embodiments thereof, taken together with the drawings in which:

DETAILED DESCRIPTION OF EMBODIMENTS

Figure 1:
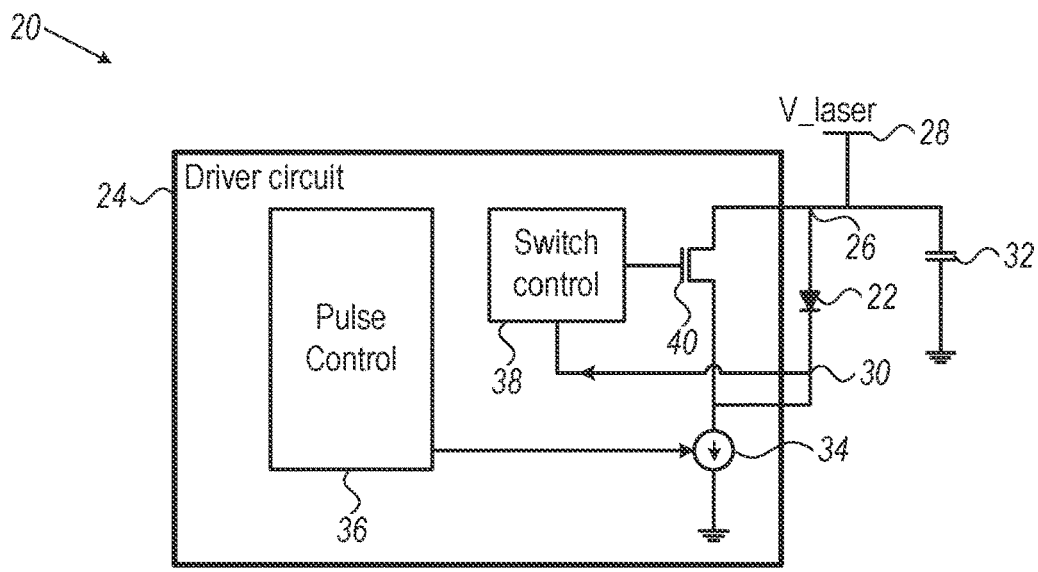
FIG. 1 is a schematic circuit diagram showing an optoelectronic device, in accordance with an embodiment of the invention.

Various schemes for driving VCSELs (and other pulsed solid-state emitters) are known in the art. For example, a high-power driver with a push-pull output stage can be used to sharpen the optical pulses that are generated by the VCSEL. Such schemes are less suitable for use in portable, battery-powered devices, however, which require low power consumption and low thermal dissipation.

To achieve high peak current with low average power consumption, these sorts of portable devices may use a unidirectional current source, which quickly forces current through the VCSEL in one direction, and then quickly turns off the current until the next pulse. (The term "current source," as used in the context of the present description and in the claims, includes sources of both positive and negative currents, which are commonly referred to respectively as current sources and current sinks.) When this sort of scheme is used, however, residual charge remains at the anode of the VCSEL even after the current source has been shut off. This residual charge causes the VCSEL to continue emitting optical radiation, with the result that the optical pulse has a long "tail" following the end of the current pulse. When the VCSEL is used in a ToF-based depth mapper, this lengthening of the optical pulses can have a deleterious effect on depth mapping performance, as explained above.

Embodiments of the present invention that are described herein address this problem by rapidly discharging a laser diode, such as a VCSEL, at the conclusion of the current pulse, while maintaining an overall low-power, unidirectional driving architecture. In these embodiments, the anode of the laser diode is connected to a driving voltage, and a driver circuit drives currents pulses through the laser diode from the anode to the cathode. One terminal of a high-speed discharge switch is connected to the cathode terminal of the laser diode, while the other terminal of the discharge switch is connected to a discharge voltage, which is equal to or greater than the driving voltage. When the discharge switch is closed, it raises the cathode terminal to the discharge voltage, thus discharging the residual charge and terminating the optical emission with a sharp falling edge.

In some embodiments, the discharge switch is connected in parallel with the laser diode, so that when the switch is closed, it forms a short circuit between the anode terminal and the cathode terminal of the laser diode. (In this case, the discharge voltage is equal to the driving voltage.) In alternative embodiments, the discharge voltage is greater than the driving voltage, so that closing the switch reverse-biases the laser diode.

In the disclosed embodiments, the discharge switch is triggered in response to the actual current pulses produced by the driver circuit. Specifically, the discharge switch is controlled by a switch control circuit, with an input connected to the cathode terminal of the laser diode and an output connected to close the discharge switch in response to the current pulses occurring at the input. The direct feedback path from the driver circuit output to the discharge switch enables the timing of the discharge to be synchronized precisely with the driving pulse simply and robustly, without the need for precise timing circuits and calibration mechanisms. After the current pulse has ended, the switch control circuit will automatically reopen the discharge switch, thus ensuring that the discharge path is disconnected when the next driving pulse begins.

FIG. 1 is a schematic circuit diagram showing an optoelectronic device 20, in accordance with an embodiment of the invention. This device comprises a VCSEL 22, which emits short pulses for use, for example, in ToF-based depth sensing. An anode terminal 26 of the VCSEL is connected to a voltage source 28 ($V_{laser}$), which charges a capacitor 32 between laser pulses. A cathode terminal 30 of VCSEL 22 is connected to a driver circuit 24, in which a current source 34 (in this case embodied as a current sink) is triggered by pulse control logic 36 to drive short, intense, unidirectional pulses through the VCSEL, from anode terminal 26 to the cathode terminal 30, thus causing the VCSEL to emit optical pulses. Driver circuit 24 is thus unidirectional, with low power consumption and heat dissipation, in contrast to bidirectional driver circuits based on push-pull arrangements.

A discharge switch 40 is connected in parallel with VCSEL 22, with one terminal of the switch connected to anode terminal 26 and the other terminal of the switch connected to cathode terminal 30. Thus, when switch 40 is closed, it forms a short circuit between anode terminal 26 and cathode terminal 30. Discharge switch 40 is triggered by a switch control circuit 38, which has an input connected to cathode terminal 30 and an output connected to close discharge switch 40 in response to the current pulses occurring at the input. In the pictured configuration, discharge switch 40 is a p-channel device, such as a PNP transistor, comprising an emitter connected to anode terminal 26, a collector connected to cathode terminal 30, and a base connected to the output of switch control circuit 38. Alternatively, discharge switch 40 may comprise a PMOS transistor, comprising a drain connected to the anode terminal, a source connected to the cathode terminal, and a gate connected to the output of the switch control circuit.

The current pulse generated by driver circuit 24 causes the voltage at the driver circuit output to drop sharply, thus triggering switch control circuit 38 to close discharge switch 40. Any sort of switch control circuit with suitable properties and sufficient speed may be used for this purpose. A number of examples are shown in FIGS. 3-5.

Figure 2:
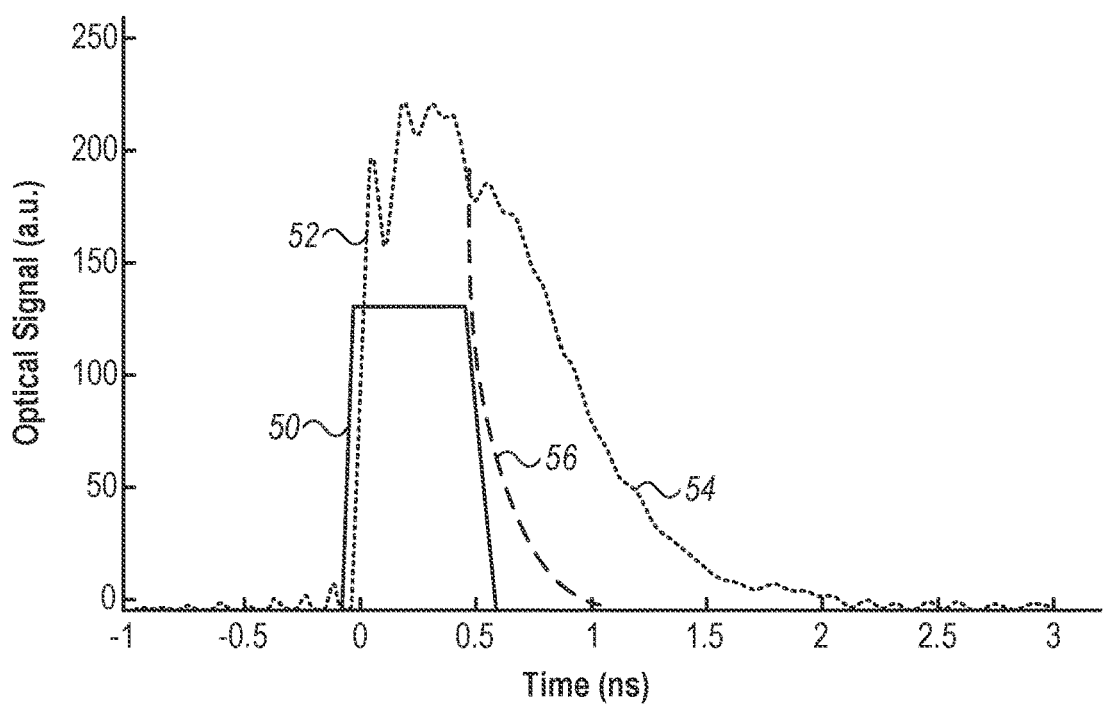
FIG. 2 is a plot showing pulse waveforms generated by the optoelectronic device of FIG. 1, in accordance with an embodiment of the invention.

FIG. 2 is a plot showing pulse waveforms generated by optoelectronic device 20 (FIG. 1), in accordance with an embodiment of the invention. The amplitudes of the pulses are shown in arbitrary units (a.u.) Current sink 34 in driver circuit 24 generates current pulses 50 with a pulse width less than 2 ns, or possibly even less than 1 ns. In the absence of discharge switch 40, however, an optical pulse 52 output by VCSEL 22 will have a long pulse tail 54, as explained above and shown in FIG. 2. This tail is cut off by means of discharge switch 40 and the switch control scheme that is shown in FIG. 1, so that optical pulse 52 terminates shortly after current pulse 50, as illustrated by a dashed curve 56 in FIG. 2.

Figure 3:
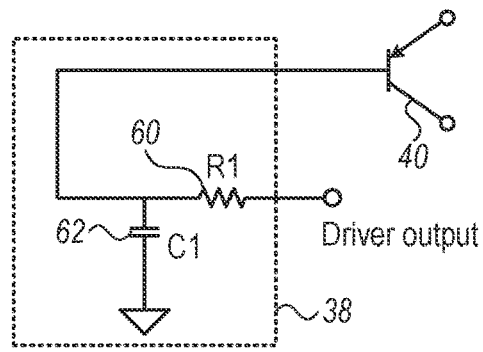
FIGS. 3, 4 and 5 are schematic circuit diagrams illustrating switch control circuits for use in an optoelectronic device, in accordance with embodiments of the invention.
Figure 4:
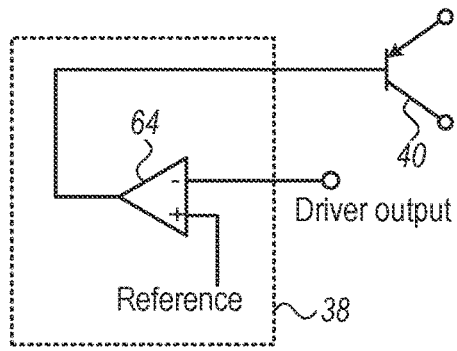
Figure 5:
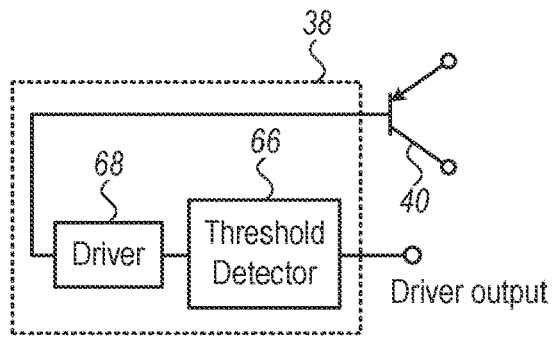

FIGS. 3, 4 and 5 are schematic circuit diagrams illustrating possible implementations of switch control circuit 38 (shown in FIG. 1), in accordance with embodiments of the invention. In all of these implementations, the input to switch control circuit 38 is connected to the output of driver circuit 24, at cathode terminal 30 of VCSEL 22, while the output of switch control circuit 38 is connected to the base of a PNP transistor, which serves in these embodiments as discharge switch 40. The circuits of FIGS. 3-5 are shown here by way of example, rather than limitation; and switch control circuit 38 may also include combinations of the features of two or more of the pictured embodiments. Alternative implementations will be apparent to those skilled in the art after reading the present description and are considered to be within the scope of the present invention.

In the embodiment of FIG. 3, switch control circuit comprises a low-pass filter, comprising a series resistor 60 and a shunt capacitor 62 connected between the input and the output. The values R1 and C1 of the components of the filter are chosen to create the required delay (typically less than 2 ns, or even less than 1 ns) between the initial, falling edge of the drive current pulse at anode terminal 26 of VCSEL 22 and the closure of discharge switch 40. Alternatively, other, more complex filters may be used in the switch control circuit to achieve the desired timing with high precision.

In the embodiment of FIG. 4, switch control circuit 38 comprises a comparator 64, which compare the voltage level at the input of the switch control circuit to a reference voltage. The negative current pulse created by current sink 34 will rapidly pull the input voltage down below the reference, thus triggering discharge switch 40. The embodiment of FIG. 5 uses a threshold detector 66 in a similar fashion, to trigger a driver 68 (such as an operational amplifier) to close discharge switch 40 when the input to switch control circuit 38 passes a predefined threshold.

Figure 6:
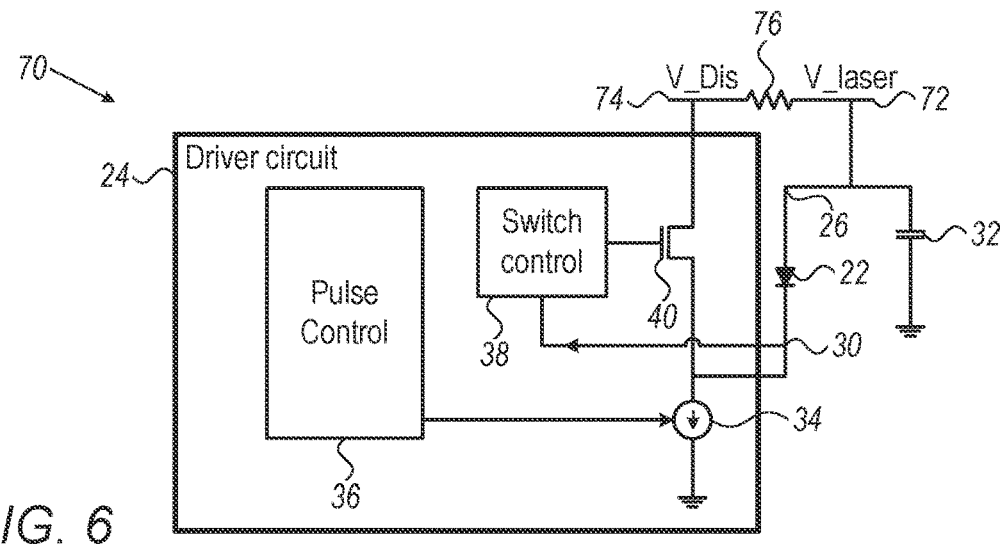
FIG. 6 is a schematic circuit diagram showing an optoelectronic device, in accordance with an alternative embodiment of the invention.

FIG. 6 is a schematic circuit diagram showing an optoelectronic device 70, in accordance with an alternative embodiment of the invention. Device 70 is similar in structure and operation to device 20 (FIG. 1), and components of device 70 in FIG. 6 are labeled with the same indicator numbers as their counterparts in device 20. In device 70, however, anode terminal 26 of VCSEL 22 is connected to a driving voltage source 72 ($V_{laser}$) while discharge switch 40 has one switch terminal connected to cathode terminal 30 and the other switch terminal connected to a discharge voltage source 74 ($V_{dis}$), at a higher voltage than $V_{laser}$. Thus, when switch 40 is closed, VCSEL 22 will be reverse-biased, so that the tail of the optical pulse that is output by the VCSEL may be cut off even more sharply than in the case of device 20.

The circuits in device 70 are typically implemented on a single semiconductor chip, and the need to provide two different voltages ($V_{laser}$ and $V_{dis}$) can increase the cost and size of the chip, relative to device 20. To mitigate these problems, $V_{laser}$ and $V_{dis}$ may be derived from the same power supply, with a resistor 76 between voltage source 74 and voltage 72 giving rise to the desired voltage drop of $V_{laser}$ relative to $V_{dis}$. Resistor 76 may be introduced as part of the circuit design of device 70, or it may take advantage of existing parasitic resistance in the circuits of the chip.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
a laser diode having a cathode terminal and an anode terminal, which is connected to a driving voltage;
a driver, which is coupled to drive current pulses through the laser diode from the anode terminal to the cathode terminal;
a discharge switch, which has a first switch terminal connected to the cathode terminal and a second switch terminal connected to a discharge voltage, which is equal to or greater than the driving voltage, and is configured, when closed, to raise the cathode terminal to the discharge voltage; and
a switch control circuit, which has an input connected to the cathode terminal and an output connected to close the discharge switch in response to the current pulses occurring at the input.

2. The device according to claim 1, wherein the discharge switch is connected in parallel with the laser diode, such that the discharge voltage is equal to the driving voltage, and the switch is configured, when closed, to form a short circuit between the anode terminal and the cathode terminal.

3. The device according to claim 1, wherein the discharge voltage is greater than the driving voltage, and the switch is configured, when closed, to reverse-bias the laser diode.

4. The device according to claim 1, wherein the laser diode comprises a vertical-cavity surface-emitting laser (VCSEL).

5. The device according to claim 1, wherein the driver comprises a current source and is configured to generate the current pulses with a pulse width less than 2 ns.

6. The device according to claim 1, wherein the discharge switch comprises a PNP transistor, comprising an emitter serving as the second switch terminal, a collector serving as the first switch terminal, and a base connected to the output of the switch control circuit.

7. The device according to claim 1, wherein the discharge switch comprises a PMOS transistor, comprising a drain serving as the second switch terminal, a source serving as the first switch terminal, and a gate connected to the output of the switch control circuit.

8. The device according to claim 1, wherein the switch control circuit comprises a low-pass filter connected between the input and the output.

9. The device according to claim 1, wherein the switch control circuit comprises a comparator, which is configured to compare the input to a reference voltage.

10. The device according to claim 1, wherein the switch control circuit comprises a threshold detector, which is configured to close the discharge switch when the input passes a predefined threshold.

11. A method for driving a laser diode having a cathode terminal and an anode terminal, the method comprising:
connecting the anode terminal to a driving voltage;
connecting a driver to the cathode terminal so as to drive current pulses through the laser diode from the anode terminal;
connecting a first switch terminal of a discharge switch to the cathode terminal and a second switch terminal of the discharge switch to a discharge voltage, which is equal to or greater than the driving voltage, such that when the discharge switch is closed, the cathode terminal is raised to the discharge voltage;
coupling an input of a switch control circuit to the cathode terminal; and
connecting an output of the switch control circuit to close the discharge switch in response to the current pulses occurring at the input.

12. The method according to claim 11, wherein connecting the discharge switch comprises coupling the discharge switch in parallel with the laser diode, such that the discharge voltage is equal to the driving voltage, and the switch, when closed, forms a short circuit between the anode terminal and the cathode terminal.

13. The method according to claim 11, wherein the discharge voltage is greater than the driving voltage, and the switch, when closed, reverse-biases the laser diode.

14. The method according to claim 11, wherein the laser diode comprises a vertical-cavity surface-emitting laser (VCSEL).

15. The method according to claim 11, wherein the driver comprises a current source and is configured to generate the current pulses with a pulse width less than 2 ns.

16. The method according to claim 11, wherein the discharge switch comprises a PNP transistor, comprising an emitter serving as the second switch terminal, a collector serving as the first switch terminal, and a base connected to the output of the switch control circuit.

17. The method according to claim 11, wherein the discharge switch comprises a PMOS transistor, comprising a drain serving as the second switch terminal, a source serving as the first switch terminal, and a gate connected to the output of the switch control circuit.

18. The method according to claim 11, wherein the switch control circuit comprises a low-pass filter connected between the input and the output.

19. The method according to claim 11, wherein the switch control circuit comprises a comparator, which is configured to compare the input to a reference voltage.

20. The method according to claim 11, wherein the switch control circuit comprises a threshold detector, which is configured to close the discharge switch when the input passes a predefined threshold.

* * * * *